United States Patent [19]

Hart et al.

[11] Patent Number: 5,060,027

[45] Date of Patent: Oct. 22, 1991

[54] LIGHT EMITTING DIODE ARRAY WITH ALIGNED SOLDER BUMPS

[75] Inventors: Peter B. Hart, Duston; John Gooding, Daventry, both of England

[73] Assignee: Plessey Overseas Limited, Ilford, England

[21] Appl. No.: 469,454

[22] PCT Filed: Aug. 11, 1989

[86] PCT No.: PCT/GB89/00926
§ 371 Date: May 15, 1990
§ 102(e) Date: May 15, 1990

[87] PCT Pub. No.: WO90/01803
PCT Pub. Date: Feb. 22, 1990

[30] Foreign Application Priority Data

Aug. 11, 1988 [GB] United Kingdom ............... 8819070

[51] Int. Cl.$^5$ ................................... H01L 33/00
[52] U.S. Cl. ............................... 357/17; 357/68; 357/45; 357/16; 357/71

[58] Field of Search ............... 357/17, 45, 16, 75, 357/68, 65, 71

[56] References Cited

U.S. PATENT DOCUMENTS

| | | | |
|---|---|---|---|
| 4,021,838 | 5/1977 | Warwick | 357/75 X |
| 4,074,299 | 2/1978 | Kusano et al. | 357/75 X |
| 4,122,479 | 10/1978 | Sugawara et al. | 357/75 X |
| 4,990,971 | 2/1991 | Le Creff | 357/17 |

FOREIGN PATENT DOCUMENTS 61-198690 9/1986 Japan ................... 357/17

Primary Examiner—William Mintel
Attorney, Agent, or Firm—Fleit, Jacobson, Cohn, Price, Holman & Stern

[57] ABSTRACT

A close-spaced diode array in which connection to driver circuitry is enabled by application of a flip-chip solder bonding technique. Not only does this allow dense packing, high pixel content to be achieved but has concomitant advantages of increased light efficiency and improved heat sinking.

7 Claims, 2 Drawing Sheets

LIGHT EMITTING DIODE ARRAY WITH ALIGNED SOLDER BUMPS

The present invention concerns improvements in or relating to the manufacture of light emitting diode (LED) arrays, more particularly arrays comprised of many close-spaced diode elements.

There are many modern-day applications that require displays having a large number of display elements (pixels) on a fine geometry for use in optical systems. To provide good imagery requires as many as 500×500 pixels but it is possible to produce recognizable pictures with a much lower pixel count. The conventional cathode ray tube (CRT) can give extremely good definition but is bulky and requires high power and high voltages. Alternative display technologies can be more compact but also have their own particular problems. Passive liquid crystal device (LCD) displays use little power, but can be difficult to address and multiplex and also require back-lighting for use in the dark.

LED arrays made by hybrid techniques are relatively coarse in geometry, it being difficult to achieve a closer pitch than 0.5 mm. For finer geometry arrays in LED'S it is necessary to fabricate monolithic structures but this presents difficulties in addressing, since without specialized isolation techniques all the LED's in a monolithic structure have a common cathode and require individual connections. For fine geometries and for large numbers of pixels interconnection by conventional wire-bonding is quite impracticable.

The present invention is intended to provide a remedy and thus enables the provision of an array of close-spaced elements complete with connections to LED driver circuitry.

The solution to the aforesaid problem is based upon:

a) the fabrication of the LED array in a material with a transparent substrate so that the array can be viewed from the reverse side; and b) making the interconnections to the array by 'flip-chipping' the array directly onto the silicon driving circuitry.

In accordance with a first aspect of this invention there is provided a light emitting diode array comprising an optically transparent substrate (1) of semiconductor material in which a multiplicity of light emitting diodes (10) are defined on one surface of the substrate, each of said diodes (10) having an electrical contact (4) on one surface of the substrate, said substrate (1) being provided with a common electrode of an optically transparent material for all the diodes (10), a further substrate (6) in which a multiplicity of driver circuits are defined corresponding to the number and positions of the light emitting diodes 10 on the substrate (1), each driver circuit having a corresponding contact and wherein the contacts of the light emitting diodes and the corresponding contacts of the driver circuits are in alignment and in electrical soldered contact.

In the foregoing array, light is transmitted in all directions from each addressed diode. That light which is transmitted in a reverse direction, that is, into the body of the optically transparent substrate, is used to provide the visual display.

In accordance with a second aspect of this invention there is provided a method of manufacturing a light emitting diode array, which comprises providing a semiconductor substrate (1) of optically transparent material having a multiplicity of light emitting diodes (10), and a common electrode of an optically transparent material for all of said diodes, each diode having an electrical contact (4) on one surface of the substrate, providing a further substrate (6) in which a multiplicity of contacts are defined corresponding to the number and positions of the light emitting diodes (10) on the substrate (1), depositing a gauged amounted of solder upon each contact of at least one of the aforesaid substrates, winging the substrates into surface contact which the electrical contact of each facing and in alignment, and reflowing the solder to form solder bump (8) connecting the light emitting diodes to the corresponding driver circuits.

The foregoing solution has additional advantages in LED performance. In conventional fine geometry LED structures driven at high current densities, current crowding effects result in much of the light being generated underneath the contact area. With the flip-chip approach the diode is viewed from the reverse side, and all the emitting area is visible with a consequent increase in device efficiency. Improved diode performance also will result from better heat-sinking.

In an example of the proposed structure, LED's would be fabricated in a 100×100 array by standard diffusion techniques in GaAsP on GaP. The light-emitting region is nitrogen doped, and the emission wavelength is determined by the As/P ratio. The LED's would be (say) 40 microns in diameter and on an 80 micron pitch, giving a total chip size of 9 mm×9 mm. Contact to the diode would be by individual dots completely covering the diffused region. Use of solder-bump technology would then allow contact to a corresponding geometry silicon driver chip. The silicon driver chip can then control the intensity of each LED in accordance with received data. It can also be used to apply corrections for non-uniformity in the LED array. The invention will now be further described by way of example with reference to the accompanying drawings:

Figure 1:
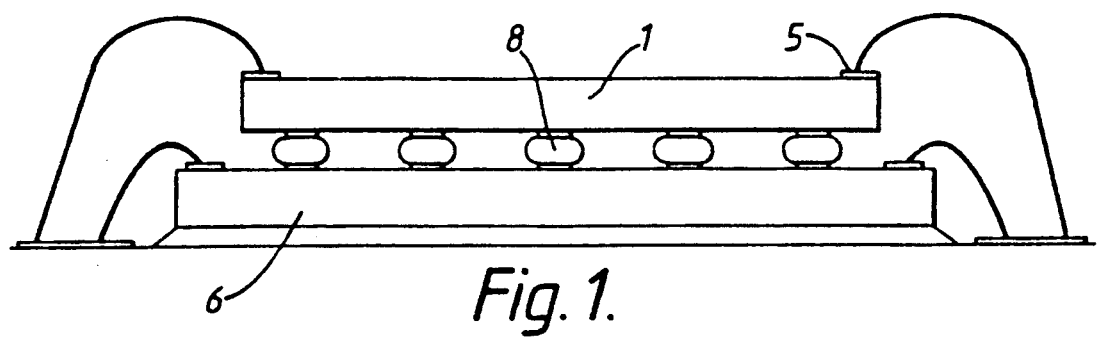
FIG. 1 shows a side view of a light emitting array embodying the invention.
Figure 2:
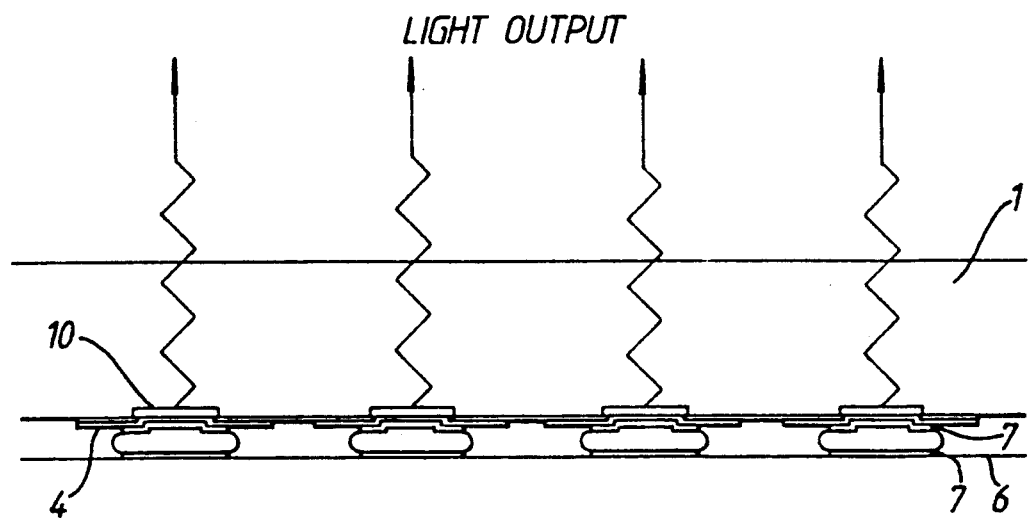
FIG. 2 is a section through the LED array of FIG. 1 showing the direction of light output from the light emitting diodes of the array.
Figure 3:
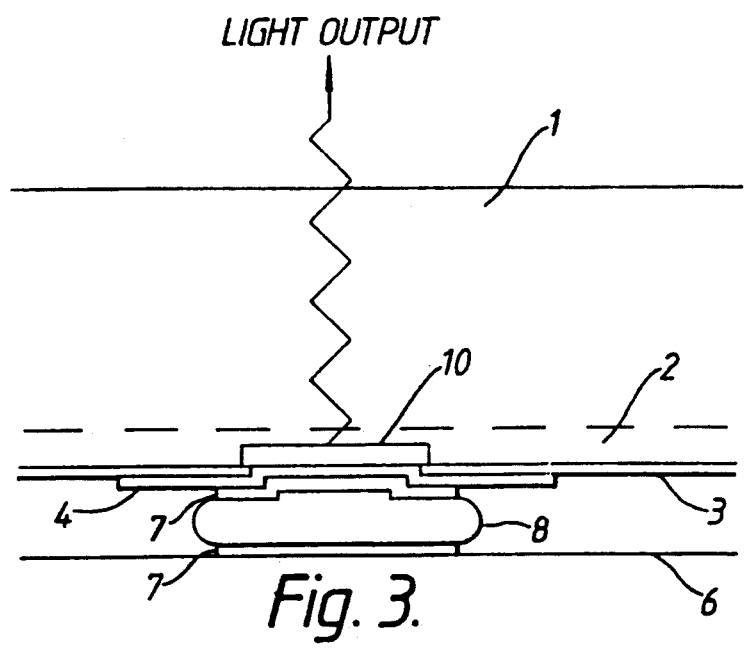
FIG. 3 shows a single LED of the array shown in FIG. 1, the single LED being soldered to corresponding contact on an active silicon substrate containing driver circuits.
Figure 4:
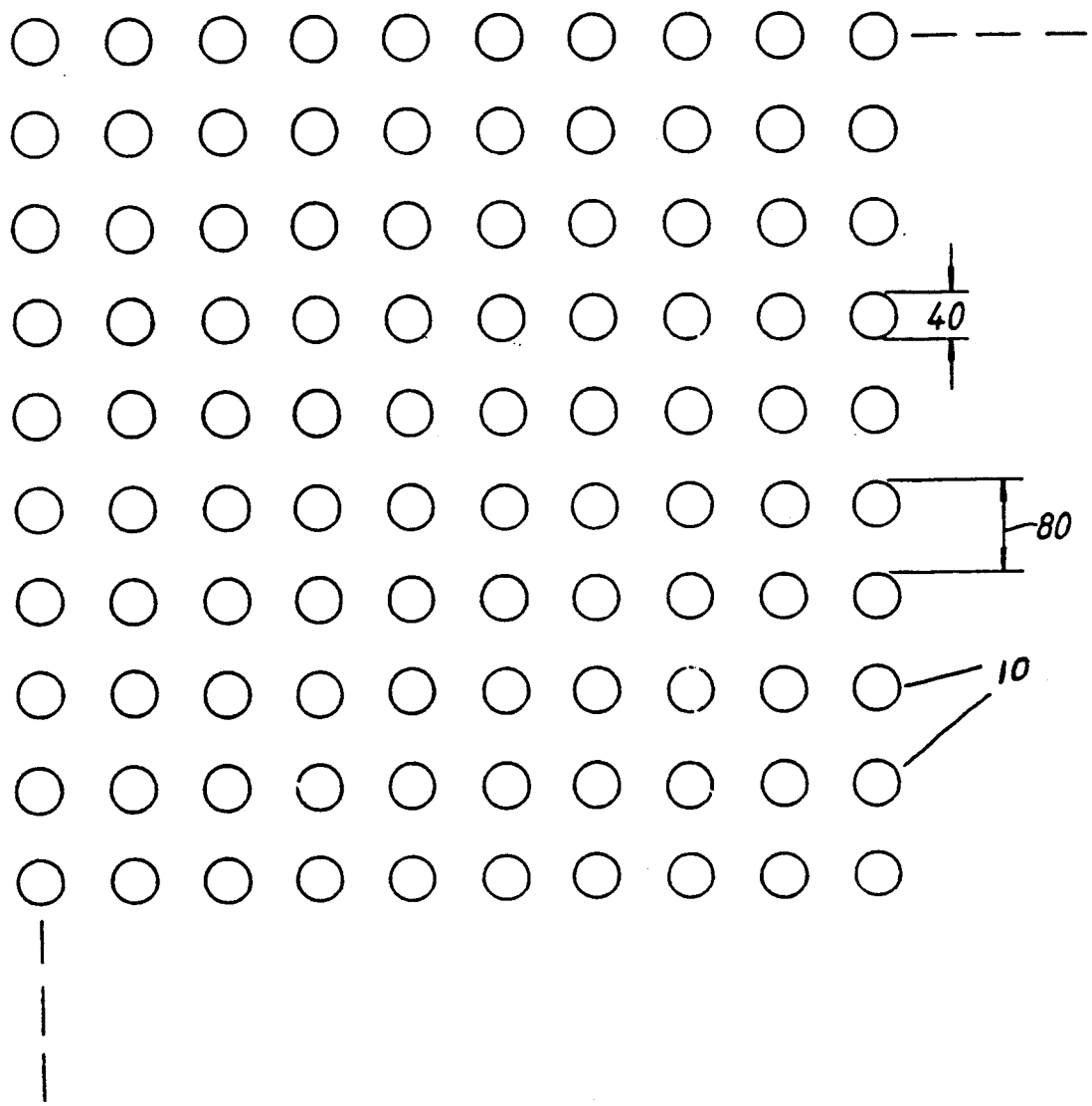

FIG. 4 shows a part of a two dimensional LED array embodying the invention. As shown in FIGS. 1 to 3, an array of light-emitting diodes 10 is provided on an optically transparent GaP substrate 1. The substrate 1 is formed with a light emitting GaAsP region 2 which is nitrogen doped. The emission wavelength of the region 2 is determined by As/P ratio.

The light emitting diodes are formed on the substrate 1, by forming thereon a layer 3 of $Si_3N_4$. The layer 3 acts as an insulating diffusion barrier. The layer 3 is selectively etched at a plurality of predetermined locations on the substrate to provide exposed areas on the substrate for the formation of light emitting diodes 10. The number of etched locations preferably correspond to the number of light emitting diodes to be provided on the array. Preferably each etched location has a diameter such as to provide a light-emitting diode having a diameter 40 microns and the distance between the adjacent etched locations is such that an array of diodes 10 having 80 microns pitch is formed as shown in FIG. 4. The light-emitting diodes 10 are formed at the exposed areas of the substrate by diffusion each having a P-N junction. A metal contact 4 is thereafter evaporated on each LED in the array. The metal contact may be made of material such as aluminum silicon alloy. For all the light-emitting diodes in the array, a common electrode of an optically transparent material, which may be an N-type contact, is provided on the reverse side of the substrate. This common contact 5 is shown only for illustration purposes in FIG. 1.

An integrated circuit chip 6 having a plurality of driver circuits is provided for interconnection of each driver circuit to corresponding light-emitting diode 10. The chip 6 includes an active silicon substrate. The number of driver circuits on the active silicon substrate correspond to the number of light emitting diodes 10 and the pitch of the driver circuits on the silicon substrate correspond to the pitch of the light-emitting diodes on the substrate 1, so that each driver circuits can be individually connected to the corresponding light-emitting diode 10 in the array.

The driver circuits are connected to the light-emitting diodes by flip-chip solder bonding technique. Wet-metallisation layers 7 are provided on each light-emitting diode and on each driver circuit and a gauged amount of solder is deposited between the metallisation layers 7 and on reflowing the solder, a bump 8 is formed which connects a light-emitting diode 10 to a corresponding driver circuit on the chip 6. The advantage of the flip-chipping technique is that the diodes are viewed from the reverse side of the substrate 1, and all the emitting area is visible with a consequent in device efficiency.

We claim:

1. A light emitting diode array comprising an optically transparent substrate of semiconductor material in which a multiplicity of light emitting diodes are defined on one surface of the substrate, each of said diodes having an electrical contact on said one surface of the substrate, said substrate being provided with a common electrode of an optically transparent material for all the diodes, a further substrate in which a multiplicity of driver circuits are defined corresponding to the number and positions of the light emitting diodes on the substrate, each driver circuit having a corresponding contact and wherein the contacts of the light emitting diodes and the corresponding contacts of the driver circuits are in alignment and in electrical soldered contact.

2. An array as claimed in claim 1, in which said substrate is a GaP substrate.

3. An array as claimed in claim 2, in which a light-emitting GaAsP region is formed in said substrate.

4. An array as claimed in claim 1, in which a diameter of each light-emitting diode is 40 microns and a pitch of the light-emitting diodes in said array is 80 microns.

5. An array as claimed in claim 1 in which said solder contact includes a solder bump formed by reflowing a gauged amount of solder deposited between a light-emitting diode and its corresponding driver circuit.

6. An array as claimed in claim 1, said array being included in a display unit.

7. A display unit including an array made by a method comprising the steps of providing a semiconductor substrate of optically transparent material having a multiplicity of light emitting diodes and a common electrode of an optically transparent material for all of said diodes, each diode having an electrical contact on one surface of the substrate, providing a further substrate in which a multiplicity of driver circuits are defined corresponding to the number and positions of the light emitting diodes on the substrate, each driver circuit having an electrical contact on one surface of the further substrate, depositing a gauged amount of solder upon each contact of at least one of the aforesaid substrates, bringing the substrates into surface contact with the electrical contact of each facing and substantially in alignment, and reflowing the solder to form solder bumps connecting the light emitting diodes to the corresponding driver circuits.

* * * * *